United States Patent
Poechmueller

(10) Patent No.: US 7,134,102 B2
(45) Date of Patent: Nov. 7, 2006

(54) AUTOMATED LAYOUT TRANSFORMATION SYSTEM AND METHOD

(75) Inventor: Peter Poechmueller, Unterhaching (DE)

(73) Assignee: Infineon Technologies AG, Munich (DE)

(*) Notice: Subject to any disclaimer, the term of this patent is extended or adjusted under 35 U.S.C. 154(b) by 353 days.

(21) Appl. No.: 10/661,295

(22) Filed: Sep. 12, 2003

(65) Prior Publication Data

US 2005/0060672 A1    Mar. 17, 2005

(51) Int. Cl.
*G06F 17/50* (2006.01)
(52) U.S. Cl. .................. 716/2; 716/9; 716/11
(58) Field of Classification Search .............. 716/2, 716/7, 9–11, 21
See application file for complete search history.

(56) References Cited

U.S. PATENT DOCUMENTS

| | | | |
|---|---|---|---|
| 6,110,222 A * | 8/2000 | Minami et al. ............. 716/9 |
| 6,301,686 B1 * | 10/2001 | Kikuchi et al. ............ 716/2 |
| 6,385,758 B1 * | 5/2002 | Kikuchi et al. ............ 716/2 |
| 6,526,555 B1 | 2/2003 | Teig et al. |
| 6,536,012 B1 | 3/2003 | Mizuno |
| 6,539,533 B1 | 3/2003 | Brown, III et al. |
| 6,576,147 B1 | 6/2003 | Mukai |
| 6,584,599 B1 | 6/2003 | Fujii |
| 6,651,235 B1 * | 11/2003 | Dai et al. ................. 716/7 |
| 6,832,364 B1 * | 12/2004 | Heng et al. ............... 716/21 |
| 6,874,133 B1 * | 3/2005 | Gopalakrishnan et al. ..... 716/2 |
| 6,880,134 B1 * | 4/2005 | Drennan ................... 716/2 |
| 2004/0225986 A1 * | 11/2004 | Lin et al. ................. 716/10 |

OTHER PUBLICATIONS

Allan, G., et al., "An Yield Improvement Technique for IC Layout Using Local Design Rules," IEEE Transactions on Computer-Aided Design of Integrated Circuits and Systems, Nov. 11, 1992, pp. 1355-1362, vol. 11, No. 11.

Bamji, C., et al., "Enhanced Network Flow Algorithm for Yield Optimization," Proc Des Autom Conf; Proceedings—Design Automation Conference, Jun. 3, 1996, pp. 746-751.

Maly, W., et al., "Design of Manufacturability in Submicron Domain," Computer-Aided Design, IEEE/ACM International Conference on San Jose, CA, Nov. 10-14, 1996, pp. 690-697.

Chotin, E., et al., "A Design Planner Including a Fast Predictive Floorplanning Tool," Euro ASIC '90, May 29, 1990, pp. 208-213, Paris, France.

* cited by examiner

*Primary Examiner*—A. M. Thompson
*Assistant Examiner*—Helen Rossoshek
(74) *Attorney, Agent, or Firm*—Slater & Matsil, L.L.P.

(57) ABSTRACT

A system, an automatic machine-implemented method, and a machine-readable medium recording a set of instructions to perform such method are provided for de-compacting a layout for a portion of an integrated circuit. According to the method, a spacing is enlarged between neighboring features of a path of a plurality of paths of the layout provided that the length of the path does not then exceed a predetermined dimensional constraint and connectivity is maintained between the neighboring features and any features of the layout to which they are connected. This process is repeated to enlarge at least one other spacing of the layout.

12 Claims, 3 Drawing Sheets

AUTOMATED LAYOUT TRANSFORMATION SYSTEM AND METHOD

BACKGROUND OF THE INVENTION

The present invention relates to the fabrication of integrated circuits (ICs) and more particularly to a system and method for automatically transforming a compacted layout of an IC to a relaxed layout which satisfies an overall dimensional constraint.

In the design of ICs, it is a goal to minimize the area occupied by the circuits which make up an integrated circuit. Minimized area usually equates to good circuit performance. Signal conductors are shorter when area is minimized, thus reducing parasitic capacitance and resistance of the signal conductors, which in turn, makes the circuits faster.

Accordingly, tools used in the automated design of ICs, known as electronic design automation ("EDA") tools, tend to minimize the layout area occupied by circuits of an IC. Typically, in such automated design, a circuit design is generated by a circuit design engineer with the aid of EDA tools. From the circuit design, a set of layouts are generated for devices and/or wiring at each level of the IC.

In generating such layout, a compacting process is typically performed, in which the sizes of features and spacings between features, e.g. devices, conductive lines, etc. of the layout are reduced to minimum sizes and spacings while still preserving connections between such features. This results in the layout having minimized area.

Typically, each level of the IC is defined by a set of layouts containing the patterns for respective circuit blocks of the IC. Thus, for a particular level of an IC, a first layout is generated from a circuit design for a first circuit block, second layout is generated for a second circuit block, and so on. As part of generating a layout for a circuit block, the layout is compacted by reducing the spacings between features and sometimes the sizes of features themselves to minimum values while preserving the connections between the features of the layout. Generally, there is little flexibility to vary the sizes of features, particularly the width of conductive lines. Therefore, compacting is generally directed to reducing only the width of spacings between features.

The resulting layout must fit within the available area for the particular circuit block. In a conventional Manhattan layout, the layout spans an area of a substrate extending in a horizontal direction (the direction parallel to most lines of the layout), and also extends in a vertical direction (the direction transverse to the horizontal lines). The area available for the layout is defined by a dimensional constraint in the horizontal direction and another dimensional constraint in the vertical direction. Thus, the compacted layout must fit within the dimensional constraints provided for the circuit block in both the horizontal direction and the vertical direction.

In each of the horizontal and vertical directions, a layout can be considered to be a collection of parallel paths that are placed side-by-side. Each path of the layout runs from one edge of the layout to an opposite edge of the layout. For example, in a vertical direction, each path runs between a bottom edge and a top edge of the layout. Each path typically includes a set of modifiable elements such as segments of conductive lines, active areas, isolation trenches, etc., as well as spacings between such modifiable elements. Alternatively, each path can include only segments of conductive lines and the spacings between them, as in a layout for a metallization pattern. As used herein, the term "features"
means any such modifiable elements. The processing of a layout on the basis of the spacings between features of the paths which make up the layout provides convenient granularity.

Unfortunately, the conventional process of compacting a layout to minimum sizes and spacings can unnecessarily complicate the manufacturing process and increase the likelihood of failure. Both the fabrication of photomasks and lithographic patterning of a semiconductor substrate are very sensitive to contamination and variations in the manufacturing process. Such sensitivity increases as the spacings between features of a layout are decreased. The more features of a mask or wafer pattern that are placed at minimum spacings, the more susceptible the mask or wafer pattern becomes subject to ruination during manufacture by particle contamination such as from dust. Also, variations in the manufacturing process, for example, lithographic process variations and etching variations, affect masks and wafer patterns to a greater extent when the spacings between features are small.

Moreover, it often occurs that the spacings between certain features of a layout need not be reduced to minimum values. In an example, some paths of a circuit block layout can only be accommodated within the available area when some features are disposed at minimum spacings. However, in other paths of the same layout there is available space to place features at larger spacings.

In a conventional compacting process, the spacings between features of all paths of a layout are reduced regardless of whether the features of a particular path need to be compacted to fit within the dimensional constraint of the layout. Thus, in any compacted layout, many paths may exist in which many features of those paths are at small or minimum spacings, even though the spacings could have been made larger and those paths would still fit within a predetermined dimensional constraint for the circuit block area.

Consequently, compacting may actually decrease manufacturing yields because the features of some paths of a layout are placed at unnecessarily small spacings, leading to increased problems of contamination and reduced tolerances for photolithographic patterning and etching.

SUMMARY OF THE INVENTION

Therefore, according to an aspect of the invention, an automatic machine-implemented method is provided for de-compacting a layout for a portion of an integrated circuit. In such method, a spacing is automatically enlarged between neighboring features of a path of the layout, provided that the length of the path does not then exceed a predetermined dimensional constraint and provided that connectivity is maintained between the neighboring features and any features of the layout to which the neighboring features are connected. The step of enlarging is then repeated for at least one other spacing of the layout.

According to a preferred aspect of the invention, a method is provided for de-compacting a layout of a portion of an integrated circuit. The method includes providing a predetermined dimensional constraint for the layout in a first direction of the layout. The method further includes automatically enlarging a spacing between first and second features of a path of the layout by a predetermined amount, provided that the length of the path does not then exceed the predetermined dimensional constraint and provided that connectivity is maintained between the first and second features and any features of the layout to which the first and second features are connected. This is performed when the spacing is smaller by the predetermined amount than the larger of a first neighbor spacing between the first feature and a third feature of the path neighboring the first feature, and a second neighbor spacing between the second feature and a fourth feature of the path neighboring the second feature. The step of enlarging is then repeated in order from a smallest spacing enlargeable thereby until all spacings enlargeable by the step are enlarged as many times as they are enlargeable.

According to yet another aspect of the invention, a machine-readable medium is provided having a set of instructions recorded thereon for performing a method of de-compacting a layout for a portion of an integrated circuit.

According to another aspect of the invention, a system is provided which is operable to de-compact a layout for a portion of an integrated circuit.

DETAILED DESCRIPTION

The embodiments of the invention will now be described with reference to FIGS. 1 through 5.

Figure 1:
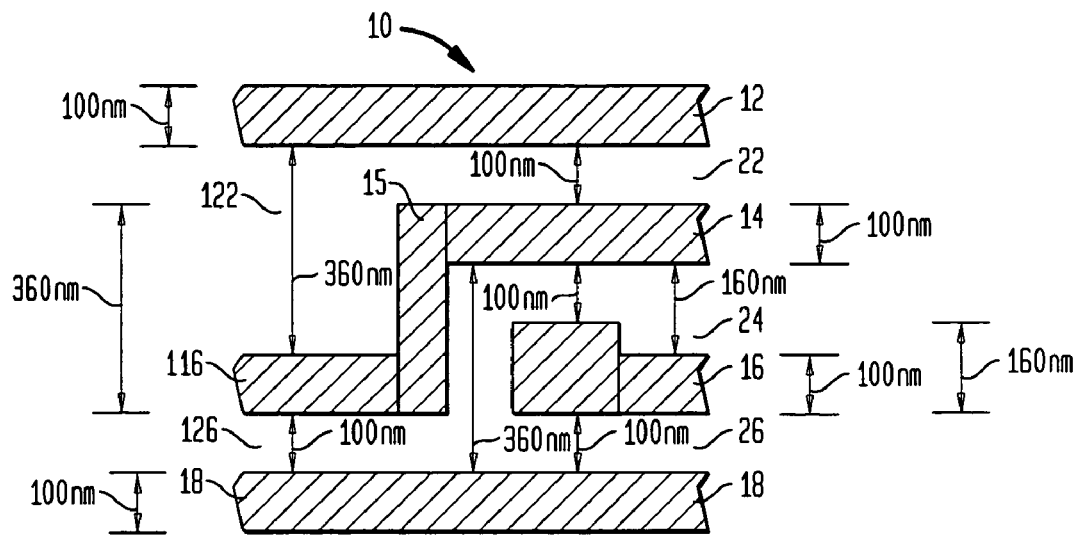
FIG. 1 is a plan view illustrating a compacted layout prior to being de-compacted according to an embodiment of the invention.

FIG. 1 is a plan (top-down) view illustrating a layout of features for a level of an IC such as a conductor pattern. As shown in FIG. 1, the layout includes a plurality of conductors, shown as hatched areas. Conductors are examples of "features", as defined herein. The areas between the hatched areas represent the spacings between conductors. The number indicated on each hatched area represents the width of each conductor and the number indicated on each spacing represents the width of each spacing. Thus, for example, as shown on the right hand side of FIG. 1, conductor segments 12 and 14 are neighbors. Each conductor segment 12, 14 has a width of 100 nm and there is a spacing 22 between them of 100 nm. Conductor segment 16 also has width of 100 nm but is separated from a neighbor conductor segment 14 by a spacing of 160 nm. Similarly, conductor segments 16 and 18 are neighbors which are separated from each other by a spacing of 100 nm. Assume that the minimum spacing allowed between features of the layout is 100 nm. On the right side of the layout in FIG. 1, it can be seen that almost all conductors are separated from a neighbor conductor by the minimum spacing of 100 nm. However, the spacing between the neighbor conductors 14 and 16 is greater than the minimum spacing, at 160 nm.

On the left hand side of FIG. 1, the layout appears different. There, conductor segment 12 has a spacing of 360 nm from neighbor conductor segment 116, while conductor segment 116 has a spacing of 100 nm from its neighbor conductor segment 18. On the left hand side it can be seen that conductor segments 116 and 18 are separated by the 100 nm minimum spacing. However, the neighbor spacing between conductor segments 12 and 116 is much greater than the minimum spacing, at 360 nm.

Therefore, on both the left hand side and the right hand side of the layout shown in FIG. 1, some spacings between features are much smaller than the neighbor spacing between one of those features and another feature. For example, features 116 and 18 on the left hand side of the layout are separated by a spacing 126 of 100 nm while features 12 and 116 are separated by a spacing 122 of 360 nm. However, it can also be observed that it is not necessary for features 116 and 18 to be spaced so closely, because there is space available within the neighbor spacing 122 of 360 nm to allow the conductor segment 116 to be shifted towards conductor segment 12. Thus, it is observed that the spacing between features 116 and 18 of the layout is unnecessarily compacted relative to the dimension of the area available for the layout, as represented by the distance between the top edge of conductor segment 12 at the top of the layout and the bottom edge of conductor segment 18 at the bottom of the layout.

Figure 2:
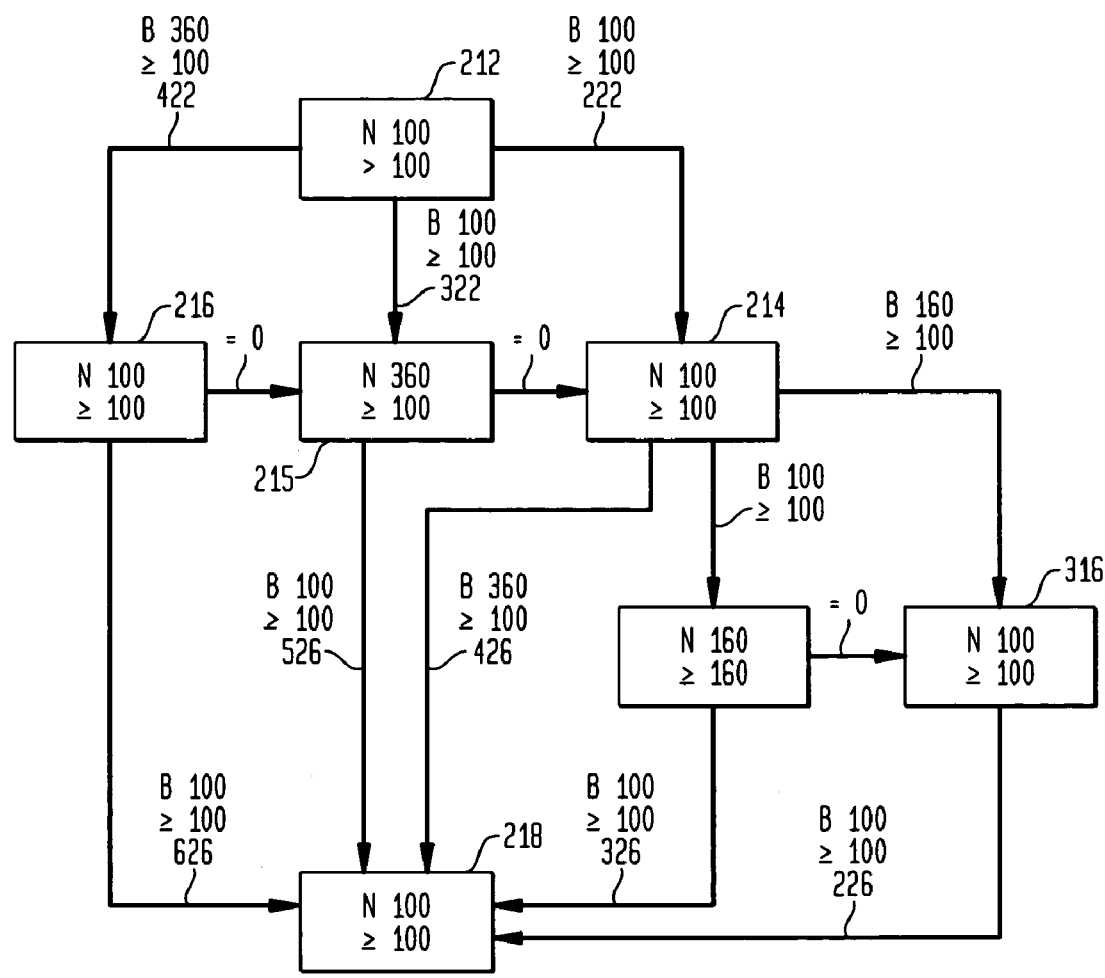
FIG. 2 is a diagram illustrating graph connectivity of branches and nodes of the layout illustrated in FIG. 1.

Embodiments of methods and systems for de-compacting the layout 10 of FIG. 1 will now be described relative to FIGS. 2 and 3. FIG. 2 is a diagram indicating the sizes of spacings and features of the layout 10 illustrated in FIG. 1, as well as constraints placed on the sizes of the spacings and features. The boxes in FIG. 2 indicate nodes of the layout, i.e., the features such as conductor segments, for example. The lines pointing to the boxes represent the branches of the layout, i.e. the spacings between the nodes. Thus, for example, node 212 corresponds to conductor 12 of FIG. 1. The neighbor nodes 214, 215 and 216 of node 212 correspond to the conductor segments 14, 15 and 116, respectively. The width of each node (conductor segment) is indicated in each box by the number which immediately follows the letter "N." The constraint on the width of each node is indicated by the number following the operator "≧."

As further shown in FIG. 2, the branches 222, 322 and 422 represent the spacings between the node 212 and the nodes 214, 215 and 216, respectively. The width of each branch (spacing) is indicated next to the branch by the number immediately following the letter "B". The constraint on the width is also indicated next to each branch by the number which follows the operator "≧". Thus, for example, for branch 222, the spacing of the branch is 100 nm and the constraint is that the spacing must be greater than or equal to 100 nm. The same is true for branch 322, in which the spacing of the branch is 100 nm and the constraint is that the spacing must be greater than or equal to 100 nm. For branch 422, while the constraint is the same, i.e. that the branch must be greater than or equal to 100 nm, the spacing of the branch is 360 nm.

The paths of the layout are represented in FIG. 2 as different ways of traversing the layout in one direction. For example, when traversing the layout in the vertical direction, i.e., either from the top of the graph to the bottom or, alternatively, from the bottom of the graph to the top, five paths are available, as evidenced by the five separate branches 226, 326, 426, 526 and 626 that point to the bottom-most node 218.

As will be further described, in the embodiments of the invention, each of the paths of the layout is examined individually to determine whether and by how much a spacing between features of a path should be enlarged. When the spacing between a particular pair of features of a path can be enlarged without the length of the path then exceeding a predetermined dimensional constraint, and connectivity is maintained relative to the pair of features, such spacing is enlarged.

In a particular embodiment, when the spacing between a particular pair of features is smaller than a neighbor spacing between a feature of that pair of features and another feature, that spacing will be enlarged. Again, this will be done as long as the change does not cause the length of the path to exceed a predetermined dimensional constraint for the layout, and the connectivity of features of that path is maintained to the features of other paths adjacent to that path.

Preferably, the larger neighbor spacing is simultaneously reduced by the same amount that the particular spacing is enlarged. In this way, connectivity of other features of that path to the features of other paths is affected little. Preferably, the width of neighbor spacings on both sides of the spacing to be enlarged are compared, and the width of the larger one of the neighbor spacings is reduced in this step.

This process of enlarging the spacing between a particular pair of features is preferably done incrementally, such that a particular spacing is enlarged by only a predetermined amount, e.g. 10 nm, at any given time, and the neighbor spacing between a feature of that pair of features is reduced by only that same predetermined amount at one time. If any changes are needed to maintain the connectivity of features of one path of the layout to another, they are also preferably done at the time that the particular spacing and then neighbor spacing are changed by the predetermined amount.

Figure 3:
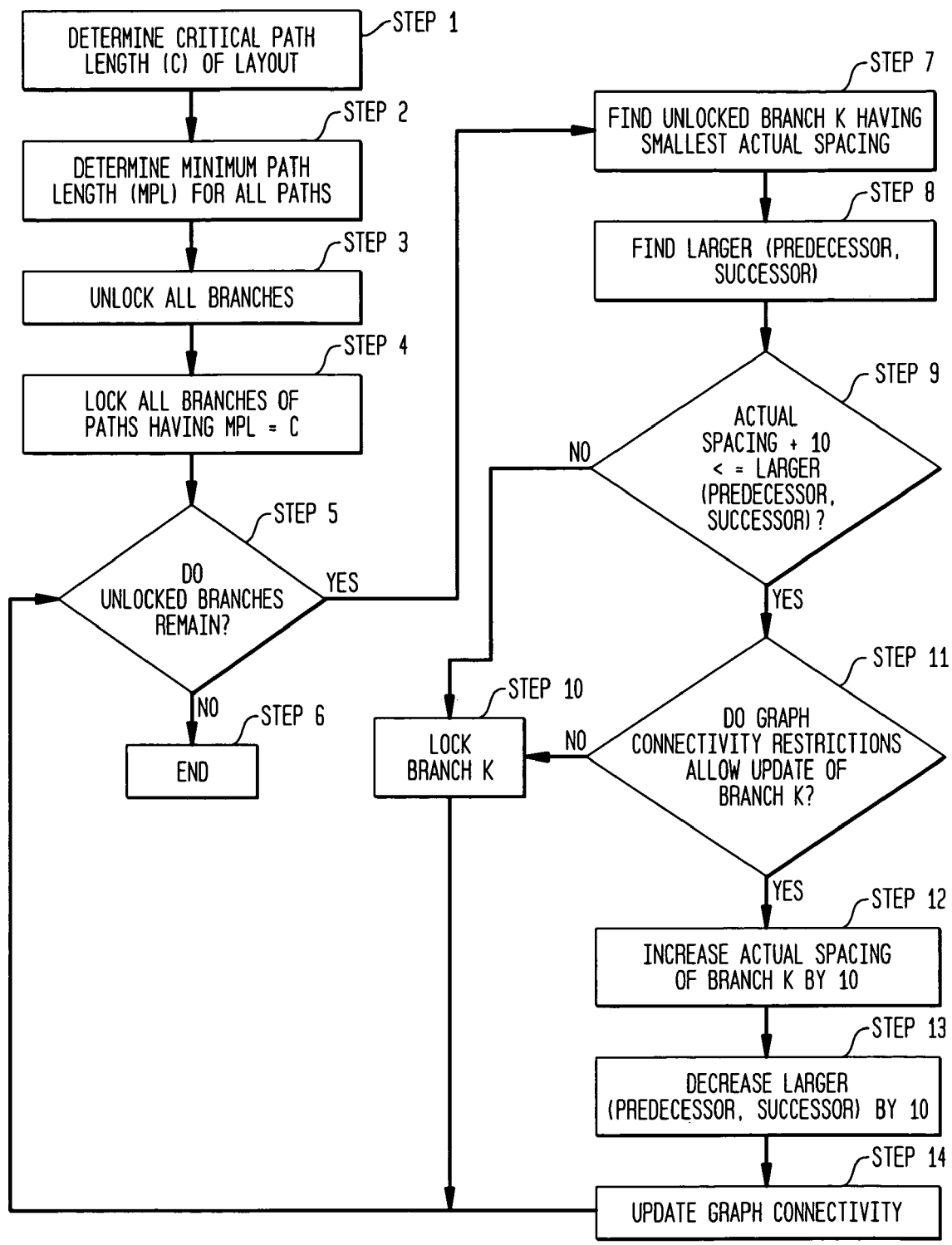
FIG. 3 is a flowchart illustrating a de-compacting method according to a preferred embodiment of the invention.

FIG. 3 is a flow diagram illustrating a preferred embodiment of a method for decompacting a layout according to the invention. In the embodiment shown in FIG. 3, the width of the spacings between features of the various paths of a layout are examined in relation to the critical path length (C) of the layout. As used herein, "critical path length" means the length of the longest path in a direction (for example, vertical or horizontal) of the layout, in which path the sizes of the features and the spacings between them cannot be reduced while still preserving connectivity to other paths. Accordingly, the critical path length represents a dimensional constraint below which the layout cannot be reduced in size in a particular direction.

The flow diagram of FIG. 3 illustratively shows a method for de-compacting a layout in a vertical direction of the layout. Thus, in a step 1 of the method, the critical path length (C) of the layout is determined. Thereafter, in step 2, a minimum path length (MPL) is determined for every path of the layout. As used herein, the minimum path length of a path means the smallest path length in which the features and the spacings of a particular path can be disposed while still preserving connectivity to other paths. Therefore, every path of the layout will have a MPL which is less than or equal to C, since C represents the longest MPL for the layout.

In an embodiment, C represents a predetermined dimensional constraint on the size of the layout in a particular direction, e.g. vertical direction. In another embodiment, an overall dimensional constraint D can be different from C, as such constraint need not be limited to a critical path length. For example, the overall dimensional constraint can be selected simply based on the maximum dimension of the area available for the particular circuit block of the layout. In such case, the overall dimensional constraint D can have a value which is larger than C.

In an exemplary embodiment in step 3, all branches, i.e. spacings between features, of the layout are unlocked, i.e. made subject to evaluation and change. This permits each branch to be examined and enlarged under appropriate circumstances, as will be described in the following.

In such embodiment, the layout is de-compacted relative to the sizes of spacings between features, rather than the sizes of the features per se. This is because greater flexibility exists for enlarging spacings between features than enlarging the sizes of features themselves. In particular, the features may include the gate conductors of transistors which generally cannot be increased or decreased in size without significantly affecting transistor characteristics and function. However, increasing the spacings between transistors helps to alleviate the problem identified above of contamination.

When MPL of a particular path equals C, the individual elements (spacings and features) of a path cannot be moved without increasing the overall size of the layout. Accordingly, in step 4, all branches of paths in which MPL is equal to C are locked to preclude the elements therein from being moved by the de-compacting process described below. Alternatively, when an overall dimensional constraint D is used instead of the critical path length C, all branches of paths in which MPL is equal to D are locked such that elements of such paths will not be moved by the de-compacting process.

Then, in step 5, a check is made at this stage to determine whether any branches of the layout are unlocked. If unlocked branches remain, then processing continues at step 7, as indicated by the "YES" decision at step 5 and consequent downward flow. However, if no unlocked branches of the layout remain, then processing ends, as indicated at step 6.

When the decision at step 5 is "YES", processing continues in step 7 by a search to determine an unlocked branch K of the layout which has the smallest actual spacing. Branch K represents a spacing between a particular pair of neighboring features of the layout. Preferably, the search is performed over the space of the entire layout. In that way, the layout is de-compacted in order from the branch K having the smallest actual spacing.

Then, in step 8, the width of the neighbor branches (spacings) on each side of branch K are examined. Because of the order in which the branches appear in a path of the layout in a direction, e.g., from top to bottom, or alternatively, from bottom to top, one of those branches is referred to as a predecessor branch and another one of the branches is referred to as a successor branch. The branch of the predecessor and successor branches that has the larger spacing is determined in this step.

Thereafter, in step 9, it is determined whether the actual spacing of the particular branch K plus a predetermined incremental spacing, e.g. 10 nm, is less than or equal to the larger of the spacings of the predecessor branch and the successor branch. In this test, only predecessor and successor branches which are unlocked are examined. If the result of this test is true, then increasing the spacing of branch K by the predetermined incremental spacing (10 nm) will at most increase the spacing of branch K to the same spacing as the larger of the predecessor and successor branches. However, if the spacing of the particular branch K plus the predetermined incremental spacing would be greater than both the spacings of the predecessor branch and the successor branch, then nothing would be gained by increasing the spacing of branch K. Therefore, in such case, branch K is locked (step 10). Nothing would be gained because, according to a preferred embodiment of the invention, if the spacing of branch K were to be increased, then the spacing of the larger one of the predecessor branch and successor branch would be correspondingly decreased (step 13), then causing that predecessor or successor branch to be smaller than branch K. Accordingly, the spacing of a branch K is increased only when it does not cause the spacing of that branch K to become larger than the larger one of the predecessor branch and successor branch of the particular path.

Assuming that the decision at step 9 is "YES", in step 11 it is determined whether graph connectivity restrictions of the layout allow the spacing of branch K to be increased by the predetermined incremental spacing. Stated another way, if the spacing of branch K is increased by the incremental spacing, it is determined whether the features (nodes) of the layout remain as fully connected to each other as they are in the original layout prior to the update. Thus, in a particular path of the layout, if the spacing of a branch K is increased by the incremental spacing, a node of the graph will be required to move by the amount of the incremental spacing. Initially this may cause an offset between the moved feature and another feature to which it connects in the layout.

It is desired to enlarge the spacing of a branch K only when connectivity between features of the layout is maintained at least as fully as it is in the original (compacted) layout, or at least is adequately maintained. Therefore, if the features cannot remain as fully or adequately connected after the spacing of branch K is enlarged, then the decision at step 11 is "NO" and branch K is then locked (step 10). This would be the case, if, for example, the features of the path adjacent to the path of branch K are at the critical path length C and cannot be moved because the branches thereof are locked, as described above relative to step 4.

In the case when the decision at step 11 is "YES", the spacing of branch K is increased by the predetermined incremental spacing, e.g., 10 nm (step 12). Preferably, a corresponding decrease is made at that time in the spacing of the larger one of the predecessor branch and the successor branch (step 13). However, the step of reducing the spacing of the predecessor branch or the successor branch is not a strict requirement for de-compacting the layout. The overall dimensional constraint D of the layout may provide available space for branch K to be enlarged without requiring the spacing of the predecessor or successor branch to be decreased. In such case, in a preferred embodiment, the predecessor or successor branch need not be decreased and then would not be decreased.

Finally, after the spacing of a branch K is enlarged, and the spacing or a predecessor or successor branch is decreased under appropriate circumstances, the connectivity of the graph is then updated, as indicated in step 14. This step preferably restores full connectivity between features of the path that is being altered and the features of neighboring paths of the layout that may have become skewed or shifted relative to the altered path due to the enlargement and reduction of spacings in the altered path. Connectivity may be restored, for example, by moving the features to be connected of the adjacent path a corresponding amount to match with the moved features of the present path.

Finally, once the branch K has been enlarged, and the spacings of other neighbor branches have been decreased, processing for that branch K is completed, and control is returned again to the decision block at step 5. At step 5, it is determined again whether any unlocked branches remain, and if so, processing continues again relative to the unlocked branch K of the layout which now has the smallest actual spacing. The rest of the processing relative to that branch K need not be described again, as such processing is repeated again on every pass of the method starting from step 5.

Figure 4:
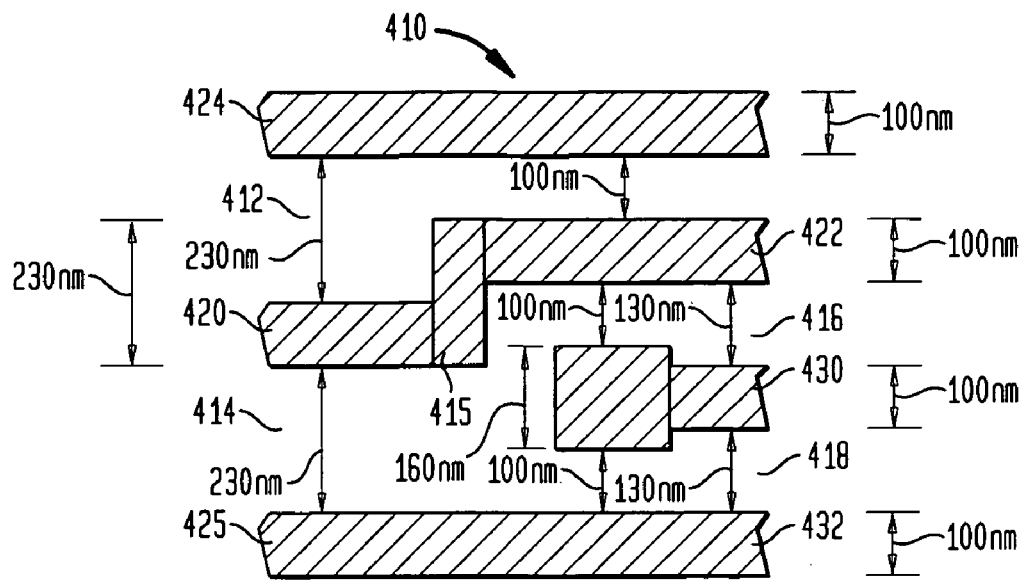
FIG. 4 is a plan view illustrating a de-compacted layout corresponding to the layout shown in FIG. 1, after being de-compacted according to an embodiment of the invention.

FIG. 4 is a plan (top-down) view illustrating a decompacted layout 410 which has been decompacted from the layout 10 of FIG. 1 according to the method shown and described above with respect to FIGS. 2 and 3. As shown in FIG. 4, use of the above-described method has resulted in the spacings 412, 414, and the spacings 416 and 418 being altered from the original spacings 122, 126 and 24 and 26, respectively, of the compacted layout (FIG. 1). Thus, instead of spacing 126 remaining at the minimum spacing, it is now increased to the spacing 414 of 230 nm. At the same time, the spacing 122 has been reduced from its initial value of 360 nm to 230 nm now (spacing 412). Similarly, spacing 26 has been enlarged from its original value of 100 nm to 130 nm now (spacing 418). Spacing 24 has also been decreased from its original value of 160 nm to 130 nm (spacing 416).

As is apparent in FIG. 4, in addition to the sizes of some spacings having changed, the location of some of the features within the layout has changed. Accordingly, graph connectivity has been updated to accommodate the changes, as described as follows.

As a result of the de-compacting process, feature 420, which corresponds to feature 116 of FIG. 1, has moved relative to features 12 and 18 of the original layout. So far, all of these changes result from the operations performed relative to the spacings 122 and 126 between features, as described in FIG. 3. However, feature 116 (FIG. 1) connects to a feature 15 of the layout, which, in turn, connects to another feature 14. Since the location of feature 116 (FIG. 1) has changed as corresponding feature 420 of the de-compacted layout (FIG. 4), the characteristics of the connecting feature 15 must also be changed.

Accordingly, updates to graph connectivity in the de-compacted layout (FIG. 4) have caused connecting feature 415 to shrink from its original size of 360 nm (FIG. 1) to 230 nm. In addition, the lower edge of the connecting feature 415 has also moved from being at a spacing of 100 nm from the neighbor feature 18 (FIG. 1) to now being at a spacing of 230 nm.

In addition, changes to the layout 10 which resulted in the spacings 416, 418 being made equal at 130 nm also required feature 430 to move relative to the neighbor features 422 and 432. Any changes required to maintain graph connectivity are again made when the feature 430 is moved. Here, the change can be made without altering the size of the feature 430 or other feature and without altering the position of any other feature of the layout 410.

Figure 5:
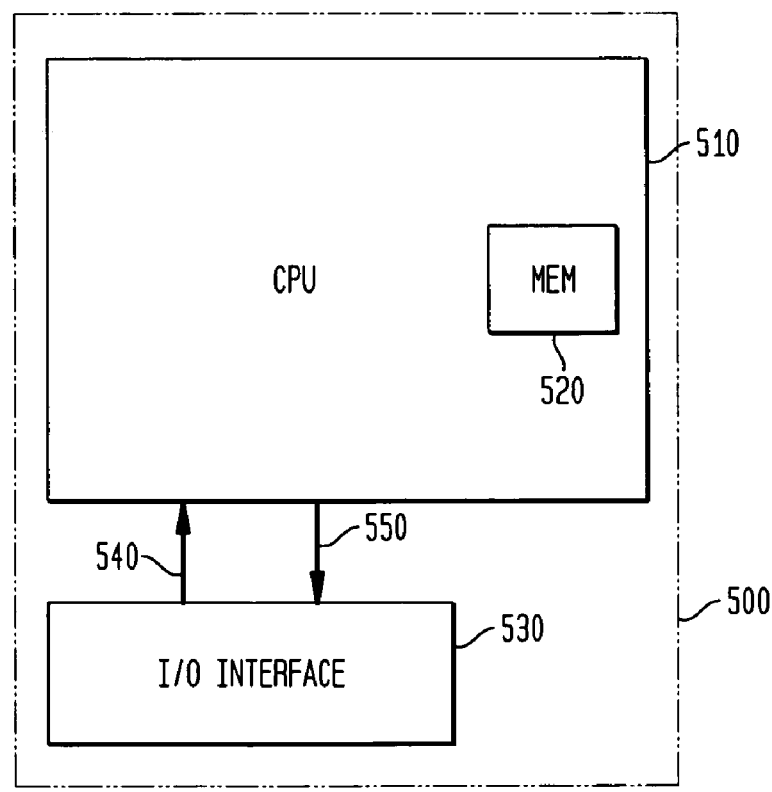
FIG. 5 is a block diagram illustrating a system for de-compacting a layout according to an embodiment of the invention.

FIG. 5 illustrates a system 500 for de-compacting a layout according to an embodiment of the invention. As shown in FIG. 5, the system includes a central processing unit (CPU) 510 provided with a memory 520. The CPU 510 may include a single processor or a plurality of processors arranged to execute instructions of a program in a parallel or semi-parallel manner. An input output (I/O) interface 530 is provided for inputting a program including instructions and data to the CPU 510 and for outputting the results of executing a program. The I/O interface 530 preferably includes one or more types of interfaces to removable digital storage media such as a magnetic disk, magneto-optic disk, read/write and/or read only optical disc, digital tape, removable disk drive and/or removable solid state memory such as a portable memory card. In addition to or in place thereof, the I/O interface preferably includes a network interface such as a modem or network adapter card for permitting transfer of information to and from a network. The I/O interface 530 may also include a display for outputting information to and/or inputting information from a user. The I/O interface 530 may additionally include one or more user interface devices such as a keyboard, mouse, speaker, joystick, scanner, printer, etc. and the like. To the extent that any of the above described types of removable storage media are present in the I/O interface, a program containing a set of instructions that is stored in such removable storage medium can be transferred as input 540 between the I/O interface 530 and the CPU 510. In addition to the program, a set of data to be operated upon by the instructions is also input over the I/O interface 530. Once the program and the data set to be operated upon have been loaded into the CPU 510, the CPU then executes the set of instructions of the program relative to the data set and provides output 550 to the I/O interface 530 connected thereto. In this manner, system 500 is operable to carry out operations on a layout to produce a de-compacted layout according to a method, preferably as illustrated in FIG. 3.

In an embodiment, a program containing instructions for performing a method according to an embodiment of the invention is stored on one or more removable storage media to be provided to the I/O interface 530 and loaded into the CPU 510. Alternatively, the program containing the instructions is transferred from a storage medium such as a memory of one or more computers or other storage devices of a network to a modem, network adapter or other device of the I/O interface 530 and further transferred therefrom to the CPU 510. As used herein, a "machine-readable storage medium" shall mean any such storage medium, whether removable or not removable. After the CPU 510 receives and loads the program into memory, the program is then executed relative to the set of data provided to the CPU 510. In such way, a method of de-compacting a layout for a portion of an integrated circuit is performed by a CPU executing a program relative to a set of data representing the layout.

As described in the foregoing, the present invention provides a rational system and method for de-compacting a layout of a portion of an integrated circuit while still providing benefits of keeping the layout within a predetermined dimensional constraint and maintaining connectivity between features of the layout. In such manner, a layout can be de-compacted to fit within a predetermined dimensional constraint that may be equal to the critical path length of the layout, or alternatively, be equal to the size of the area allotted therefor on an IC. In this way, a de-compacted layout results which can help reduce failures in mask-making and photolithographic patterning, and thereby help increase turn-around-time for retooling of production masks and increase manufacturing yields of ICs, respectively.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An automatic machine-implemented method of de-compacting a layout of a portion of an integrated circuit, comprising the steps of:
   (1) determining a critical path length (C) of the layout portion;
   (2) determining a minimum path length (MPL) for every path within the layout;
   (3) unlocking all branches of the layout;
   (4) determining any branches of the paths in the layout where the minimum path length (MPL) for that path is equal to the critical path length (C) and locking those branches of the layout;
   (5) determining whether any branches of the layout remain unlocked, if no branches remain unlocked then the method is complete;
   (6) determining which of the unlocked branches of the layout has the smallest actual spacing and designating that branch as the branch (K) for processing;
   (7) determining the width of the spacing between the neighbor branches on either side of branch (K);
   (8) determining whether the actual spacing of the branch (K) plus a predetermined incremental spacing amount is less than or equal to the larger of the spacing of that unlocked branch that is the predecessor branch and less than or equal to the spacing of the unlocked branch that is the successor branch, and if the spacing of the particular branch (K) plus the predetermined incremental spacing amount is not less than both the spacing of the predecessor branch and the spacing of the successor branch, locking the particular branch (K) and returning to the step (5);
   (9) determining whether the graph connectivity restrictions of the layout allow the spacing of the particular branch (K) to be increased by the predetermined incremental spacing, if the graph connectivity restrictions of the layout does not allow the spacing far the particular branch (K) to be increased, locking the particular branch and returning to the step (5);
   (10) increasing the spacing of the particular branch (K) by the predetermined incremental spacing amount;
   (11) updating the graph connectivity of the layout; and
   (12) returning to step (5).

2. The method of claim 1, and further comprising:
   (13) subsequent to performing step (10) and prior to performing step (11), decreasing the spacing of the larger of the predecessor branch and the successor branch to the branch (K) by the predetermined incremental spacing.

3. The method of claim 1, wherein the critical path length (C) represents a dimensional constraining below which the layout portion cannot be reduced in size in a particular direction.

4. The method of claim 1, wherein the minimum path length (MPL) represents the smallest path length in which the features and the spacing of a particular path can be disposed while still preserving connectivity to other paths in the layout.

5. A machine-readable medium having recorded on it a set of instructions which when executed performs an automatic machine-implemented method of de-compacting a layout of a portion of an integrated circuit, comprising the steps of:
   (1) determining a critical path length (C) of the layout portion;
   (2) determining a minimum path length (MPL) for every path within the layout;
   (3) unlocking all branches of the layout;
   (4) determining any branches of the paths in the layout where the minimum path length (MPL) for that path is equal to the critical path length (C) and locking those branches of the layout;
   (5) determining whether any branches of the layout remain unlocked, if no pats remain unlocked then the method is complete;

(6) determining which of the unlocked branches of the layout has the smallest actual spacing and designating tat branch as the branch (K) for processing;
(7) determining the width of the spacing between the neighbor branches on either side of branch (K);
(8) determining whether the actual spacing of the branch (K) plus a predetermined incremental spacing amount is less than or equal to the larger of the spacing of the unlocked branch that is the predecessor branch and to the spacing of the unlocked path that is the successor branch, and if the spacing of the particular branch (K) plus the predetermined incremental spacing amount is not less than both the spacing of the predecessor branch and the spacing of the successor branch, locking the particular branch (K) and returning to the step (5);
(9) determining whether the graph connectivity restrictions of the layout allow the spacing of the particular branch (K) to be increased by the predetermined incremental spacing amount, if the graph connectivity restrictions of the layout does not allow the spacing for the particular branch (K) to be increased, locking the particular branch (K) and returning to the step (5);
(10) increasing the spacing of the particular branch (K) by the predetermined incremental spacing amount;
(11) updating the graph connectivity of the layout; and
(12) returning to step (5).

6. The machine readable medium of claim 5, and further comprising:
(13) subsequent to performing step (10) and prior to performing step (11), decreasing the spacing of the larger of the predecessor branch and the successor branch to the branch (K) by the predetermined incremental spacing amount.

7. The machine readable medium of claim 5, wherein the critical path length (C) represents a dimensional constraining below which the layout portion cannot be reduced in size in a particular direction.

8. Tho machine-readable medium of claim 5, wherein the minimum path length (MPL) represents the smallest path length in which the features and the spacing of a particular path can be disposed while still preserving connectivity to other paths in the layout.

9. A system operable to de-compact a layout for a portion of an integrated circuit, said system comprising a processor that executes an automatic machine implemented method of de-compacting a layout of a portion of an integrated circuit, comprising the steps of:
(1) determining a critical path length (C) of the layout portion;
(2) determining a minimum path length (MPL) for every path within the layout portion;
(3) unlocking all branches of the layout portion;
(4) determining any branches of the paths in the layout portion where the minimum pat length (MPL) for that path is equal to the critical path length (C), and Jocking those branches of the layout;
(5) determining whether any branches of the layout remain unlocked, if no branches remain unlocked then the method is complete;
(6) determining which of the unlocked branches of the layout has the smallest actual spacing and designating that branch as the branch (K) for processing;
(7) determining the width of the spacing between the neighbor branches on either side of branch (K);
(8) determining whether the actual spacing of the branch (K) plus a predetermined incremental spacing amount is less than or equal to the larger of the spacing of that unlocked branch that is the predecessor branch and less than or equal to the spacing of the unlocked branch that is the successor branch, and if the spacing of the particular branch (K) plus the predetermined incremental spacing amount is not less than both the spacing of the predecessor branch and the spacing of the successor branch, locking the particular branch (K) and returning to the step (5);
(9) determining whether the graph connectivity restrictions of the layout allow the spacing of the particular branch (K) to be increased by the predetermined incremental spacing amount, if the graph connectivity restrictions of the layout does not allow the spacing for the particular branch (K) to be increased by the predetermined incremental spacing amount, locking the particular branch (K) and returning to step (5);
(10) increasing the spacing of the particular branch (K) by the predetermined incremental spacing amount;
(11) updating the graph connectivity of the layout; and
(12) returning to step (5).

10. The system of claim 9, and further comprising: (13) subsequent to performing step (10) and prior to performing step (11), decreasing the spacing of the larger of the predecessor branch and the successor branch to the branch (K) by the predetermined incremental spacing amount.

11. The system of claim 9, wherein the critical path length (C) represents a dimensional constraining below which the layout portion cannot be reduced in size in a particular direction.

12. The system of claim 9, wherein the minimum path length (MPL) represents the smallest path length in which the features and the spacing of a particular path can be disposed while still preserving connectivity to other paths in the layout.

* * * * *

UNITED STATES PATENT AND TRADEMARK OFFICE
CERTIFICATE OF CORRECTION

PATENT NO. : 7,134,102 B2 Page 1 of 1
APPLICATION NO. : 10/661295
DATED : November 7, 2006
INVENTOR(S) : Poechmueller It is certified that error appears in the above-identified patent and that said Letters Patent is hereby corrected as shown below:

Column 10, line 28; delete "far" insert --for--
Column 10, line 66; delete "pats" insert --paths--
Column 11, line 3; delete "tat" insert --that--
Column 12, line 3; delete "Jocking" insert --locking--

Signed and Sealed this

Thirteenth Day of February, 2007

JON W. DUDAS
*Director of the United States Patent and Trademark Office*